United States Patent
Kodama et al.

(10) Patent No.: US 11,215,671 B2
(45) Date of Patent: Jan. 4, 2022

(54) BATTERY INFORMATION PROCESSING SYSTEM, BATTERY ASSEMBLY, METHOD OF EVALUATING CHARACTERISTIC OF BATTERY MODULE, AND METHOD OF MANUFACTURING BATTERY ASSEMBLY

(71) Applicant: TOYOTA JIDOSHA KABUSHIKI KAISHA, Toyota (JP)

(72) Inventors: Kazuya Kodama, Tajimi (JP); Masahiko Mitsui, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 373 days.

(21) Appl. No.: 16/392,786

(22) Filed: Apr. 24, 2019

(65) Prior Publication Data
US 2019/0331737 A1 Oct. 31, 2019

(30) Foreign Application Priority Data
Apr. 26, 2018 (JP) .............................. JP2018-084932

(51) Int. Cl.
*G01R 31/389* (2019.01)
*H01M 10/42* (2006.01)
*H01M 10/48* (2006.01)
*G01R 31/367* (2019.01)

(52) U.S. Cl.
CPC ......... *G01R 31/389* (2019.01); *G01R 31/367* (2019.01); *H01M 10/425* (2013.01); *H01M 10/4285* (2013.01); *H01M 10/48* (2013.01); *H01M 2010/4278* (2013.01)

(58) Field of Classification Search
None
See application file for complete search history.

(56) References Cited

FOREIGN PATENT DOCUMENTS

| JP | 2003-317810 A | 11/2003 |
| JP | 2016-065832 A | 4/2016 |

OTHER PUBLICATIONS

Wu et al. "Fast Estimation of State of Charge for Lithium-Ion Batteries", Energies 2014, 7, 3438-3452 (Year: 2014).*
Masanobu Nakayama, Understanding Elemental Reactions at Electrode | Electrolyte Interface in Rechargeable Li Ion Battery by Using Electrochemical AC Impedance Spectroscopy, Journal of the Surface Science Society of Japan, Feb. 10, 2012, vol. 33, No. 2, pp. 87-92, DOI: https://doi.org/10.1380/jsssj.33.87.
English partial translation of the relevant portion of the Office Action dated Nov. 9, 2021 by the Japanese Office Action in Application No. 2018-084932.

* cited by examiner

*Primary Examiner* — Roy Y Yi
(74) *Attorney, Agent, or Firm* — Sughrue Mion, PLLC

(57) ABSTRACT

A battery information processing system includes a storage device configured to store an equivalent circuit model which expresses an AC impedance of a battery module with a plurality of circuit constants. The plurality of circuit constants include first to eighth circuit constants. The first circuit constant is a junction inductance.
The second circuit constant is a junction resistance. The third circuit constant is a solution resistance and the fourth circuit constant is a charge transfer resistance. The fifth circuit constant is a CPE index of a diffusion resistance. The sixth circuit constant is a CPE constant of the diffusion resistance. The seventh circuit constant is a CPE index of an electric double layer capacitance. The eighth circuit constant is a CPE constant of the electric double layer capacitance.

8 Claims, 13 Drawing Sheets

<EQUIVALENT CIRCUIT MODEL IN COMPARATIVE EXAMPLE>

FIG.9

| SIGN | MODEL PARAMETER |
|---|---|
| L | JUNCTION INDUCTANCE |
| R | JUNCTION RESISTANCE |
| Rsol | SOLUTION RESISTANCE |
| Rct | CHARGE TRANSFER RESISTANCE |
| p1 | CPE INDEX OF DIFFUSION RESISTANCE |
| T1 | CPE CONSTANT OF DIFFUSION RESISTANCE |
| p2 | CPE INDEX OF ELECTRIC DOUBLE LAYER CAPACITANCE |
| T2 | CPE CONSTANT OF ELECTRIC DOUBLE LAYER CAPACITANCE |

<EQUIVALENT CIRCUIT MODEL USED FOR
CALCULATION OF TIME CONSTANT>

POSITIVE ELECTRODE TIME
CONSTANT $\tau c = Rc \times Cc$
NEGATIVE ELECTRODE TIME
CONSTANT $\tau a = Ra \times Ca$ POSITIVE ELECTRODE TIME CONSTANT $\tau c =$ NEGATIVE ELECTRODE TIME CONSTANT $\tau a$ (R=1)

TIME CONSTANT RATIO R=5

TIME CONSTANT RATIO=7

TIME CONSTANT RATIO=10

BATTERY INFORMATION PROCESSING SYSTEM, BATTERY ASSEMBLY, METHOD OF EVALUATING CHARACTERISTIC OF BATTERY MODULE, AND METHOD OF MANUFACTURING BATTERY ASSEMBLY

This nonprovisional application is based on Japanese Patent Application No. 2018-084932 filed with the Japan Patent Office on Apr. 26, 2018, the entire contents of which are hereby incorporated by reference.

BACKGROUND

Field

The present disclosure relates to a battery information processing system, a battery assembly, a method of evaluating a characteristic of a battery module, and a method of manufacturing a battery assembly, and more particularly to an information processing technique for evaluating a characteristic of a battery module including a plurality of secondary batteries.

Description of the Background Art

Electrically powered vehicles incorporating battery assemblies (hybrid vehicles or electric vehicles) have increasingly been used in recent years. Battery assemblies mounted on vehicles are collected on the occasion of replacement purchase of these electrically powered vehicles. The number of collected battery assemblies is expected to rapidly increase in the future.

In general, a battery assembly may deteriorate with lapse of time or with repeated charging and discharging, and a degree of progress of deterioration is different for each collected battery assembly. Therefore, it has been required to evaluate characteristics of the collected battery assemblies (diagnose a degree of progress of deterioration) and perform appropriate processing for recycling the battery assemblies in accordance with results of evaluation.

An alternating-current (AC) impedance measurement method has been known as an approach to evaluation of characteristics of a secondary battery. For example, Japanese Patent Laying-Open No. 2003-317810 discloses a method of determining whether or not minor short-circuiting has occurred in a secondary battery based on a reaction resistance value of the secondary battery obtained by the AC impedance measurement method.

SUMMARY

In general, a battery assembly to be mounted on a vehicle includes a plurality of battery modules and each of the plurality of battery modules includes a plurality of secondary batteries (cells). In evaluating characteristics of such a battery assembly, a procedure as below may be performed. A plurality of battery modules are taken out of a collected battery assembly and an AC impedance of each battery module is measured. A manner of recycle (which may be whether or not the battery module is recyclable) is determined for each battery module based on a result of measurement of the AC impedance.

In the AC impedance measurement method, an AC signal at a frequency within a prescribed range is successively applied to a battery module and a response signal from the battery module at that time is measured. A real number component and an imaginary number component of an impedance of the battery module are calculated from the applied AC signal (an application signal) and the measured response signal, and results of calculation are discretely plotted on a complex plane. This complex impedance plot is also called a Nyquist plot. By analyzing the Nyquist plot, various characteristics such as an internal resistance value and a full charge capacity of the battery module can be evaluated (estimated). This analysis approach will briefly be described (details of which will be described later).

Initially, an equivalent circuit model representing frequency characteristics of an AC impedance of a battery module to be analyzed is prepared. The equivalent circuit model is an expression of an AC impedance (a combined impedance) of a battery module with a plurality of circuit constants (a model parameter such as a resistance component, a capacitance component, and an inductance component of the battery module). A value of each circuit constant in the equivalent circuit model is calculated by measuring an AC impedance of the battery module and performing fitting processing to decrease an error from a result of measurement (discrete actual measurement data). Correlation (for example, a function or a relational expression) between the circuit constant thus calculated (or a feature value calculated based on the circuit constant) and a characteristic (such as a full charge capacity) of the battery module is experimentally found in advance. Therefore, the characteristic of the battery module can be evaluated based on the circuit constant (feature value) of the battery module by referring to the correlation.

In this analysis process, characteristics of a battery module cannot accurately be evaluated simply by adopting an excessively simplified equivalent circuit model. Adoption of an academically precise equivalent circuit model may lead to improvement in accuracy in evaluation of characteristics of the battery module, however, such an equivalent circuit model may require a long period of time for analysis (fitting processing). Therefore, in a scenario in which a large number of battery modules should be evaluated (for example, a scenario in which a degree of progress of deterioration of battery modules taken out of collected battery assemblies is successively diagnosed as described previously), it is realistically difficult to adopt the precise equivalent circuit model.

The present disclosure was made to solve the problems above, and an object thereof is to provide an analysis technique for appropriately evaluating characteristics of a battery module based on a result of measurement of an AC impedance of the battery module.

(1) A battery information processing system according to one aspect of the present disclosure processes information for evaluating a characteristic of a battery module including a plurality of secondary batteries. The battery information processing system includes a storage device configured to store an equivalent circuit model, the equivalent circuit model expressing an AC impedance of the battery module with first to eighth circuit constants, and an evaluation device configured to calculate the first to eighth circuit constants by fitting processing of a Nyquist plot in which a result of measurement of the AC impedance of the battery module is plotted and to evaluate a characteristic of the battery module based on the equivalent circuit model including the calculated first to eighth circuit constants. The first circuit constant is a junction inductance of the battery module. The second circuit constant is a junction resistance of the battery module. The third circuit constant is a solution resistance of the battery module. The fourth circuit constant is a charge transfer resistance of the battery module. The fifth circuit constant is a constant phase element (CPE) index of a diffusion resistance of the battery module. The sixth circuit constant is a CPE constant of the diffusion resistance of the battery module. The seventh circuit constant is a CPE index of an electric double layer capacitance of the battery module. The eighth circuit constant is a CPE constant of the electric double layer capacitance of the battery module.

(2) In the equivalent circuit model, the junction inductance and the junction resistance are connected in parallel to each other, forming a parallel circuit. The solution resistance is connected in series to the parallel circuit of the junction inductance and the junction resistance. The charge transfer resistance and the diffusion resistance are connected in series to each other, forming a series circuit. The electric double layer capacitance is connected in parallel to the series circuit of the charge transfer resistance and the diffusion resistance. A combined circuit including the junction inductance, the junction resistance, and the solution resistance and a combined circuit including the charge transfer resistance, the diffusion resistance, and the electric double layer capacitance are connected in series to each other.

(3) The evaluation device is configured to evaluate the characteristic of the battery module when a capacitive loop of the battery module shown on the Nyquist plot can be approximated to a single oval.

(4) The capacitive loop can be approximated to an oval when a ratio between a positive electrode time constant representing a degree of deterioration of a positive electrode of the battery module and a negative electrode time constant representing a degree of deterioration of a negative electrode of the battery module is lower than a prescribed value.

(5) Each of the plurality of secondary batteries is a nickel metal hydride battery. The characteristic of the battery module is at least one of a full charge capacity and an internal resistance of the battery module.

According to the features in (1) to (5), the equivalent circuit model including the first to eighth circuit constants expresses an AC impedance of a battery module. The present inventors have found that, when such an equivalent circuit model is adopted, the first to eighth circuit constants (more specifically, an impedance curve including these eight circuit constants) and a full charge capacity of the battery module correlate with each other and that the full charge capacity of the battery module can be calculated based on the first to eighth circuit constants.

Since this equivalent circuit model should include only eight circuit constants, it is relatively more simplified than the precise equivalent circuit model. When a full charge capacity (which may be an internal resistance) calculated in accordance with the equivalent circuit model is compared with an actual full charge capacity, it has been confirmed that they well match with each other. Therefore, the full charge capacity can also highly accurately be calculated. In particular, when each secondary battery included in the battery module is a nickel metal hydride battery and a capacitive loop of the battery module included in the Nyquist plot can be approximated to an oval, the full charge capacity of the battery module is highly accurately calculated. When a ratio between the positive electrode time constant and the negative electrode time constant of the battery module is lower than a prescribed value, the full charge capacity is highly accurately calculated. Thus, according to the features in (1) to (5), characteristics of the battery module can appropriately be evaluated by analyzing a result of measurement of the AC impedance of the battery module.

(6) A battery assembly according to another aspect of the present disclosure includes a plurality of battery modules of which characteristic has been evaluated by the battery information processing system according to any one of claims 1 to 5.

According to the feature in (6), a battery assembly is constituted of battery modules of which characteristic has appropriately been analyzed by the features in (1) to (5). Therefore, for example, a battery assembly less in variation in characteristic (such as variation in full charge capacity) among battery modules can be provided.

(7) A method of evaluating a characteristic of a battery module according to yet another aspect of the present disclosure evaluates a characteristic of a battery module including a plurality of secondary batteries. The method of evaluating a characteristic of a battery module includes first to third steps. The first step is a step of obtaining a Nyquist plot from a result of measurement of an AC impedance of the battery module. The second step is a step of calculating first to eighth circuit constants included in an equivalent circuit model of the AC impedance of the battery module by fitting processing of the Nyquist plot. The third step is a step of evaluating a characteristic of the battery module based on the equivalent circuit model including the first to eighth circuit constants. The first circuit constant is a junction inductance of the battery module. The second circuit constant is a junction resistance of the battery module. The third circuit constant is a solution resistance of the battery module. The fourth circuit constant is a charge transfer resistance of the battery module. The fifth circuit constant is a CPE index of a diffusion resistance of the battery module. The sixth circuit constant is a CPE constant of the diffusion resistance of the battery module. The seventh circuit constant is a CPE index of an electric double layer capacitance of the battery module. The eighth circuit constant is a CPE constant of the electric double layer capacitance of the battery module.

According to the method in (7), as in the features in (1), characteristics of a battery module can appropriately be evaluated by analyzing a result of measurement of the AC impedance of the battery module.

(8) A method of manufacturing a battery assembly according to another aspect of the present disclosure includes first to fourth steps. The first step is a step of obtaining a Nyquist plot from a result of measurement of an AC impedance of a battery module including a plurality of secondary batteries. The second step is a step of calculating first to eighth circuit constants included in an equivalent circuit model of the AC impedance of the battery module by fitting processing of the Nyquist plot. The third step is a step of evaluating a characteristic of the battery module based on the equivalent circuit model including the first to eighth circuit constants. The fourth step is a step of manufacturing a battery assembly from a plurality of battery modules of which characteristic has been evaluated in the step of evaluating a characteristic. The first circuit constant is a junction inductance of the battery module. The second circuit constant is a junction resistance of the battery module. The third circuit constant is a solution resistance of the battery module. The fourth circuit constant is a charge transfer resistance of the battery module. The fifth circuit constant is a CPE index of a diffusion resistance of the battery module. The sixth circuit constant is a CPE constant of the diffusion resistance of the battery module. The seventh circuit constant is a CPE index of an electric double layer capacitance of the battery module.

The eighth circuit constant is a CPE constant of the electric double layer capacitance of the battery module.

According to the manufacturing method in (8), as in the feature in (6), a battery assembly can be manufactured from battery modules of which characteristics have appropriately been evaluated.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 9 is a diagram for illustrating a circuit constant included in the equivalent circuit model shown in FIG. 8.

DESCRIPTION OF THE PREFERRED EMBODIMENTS

Figure 1:
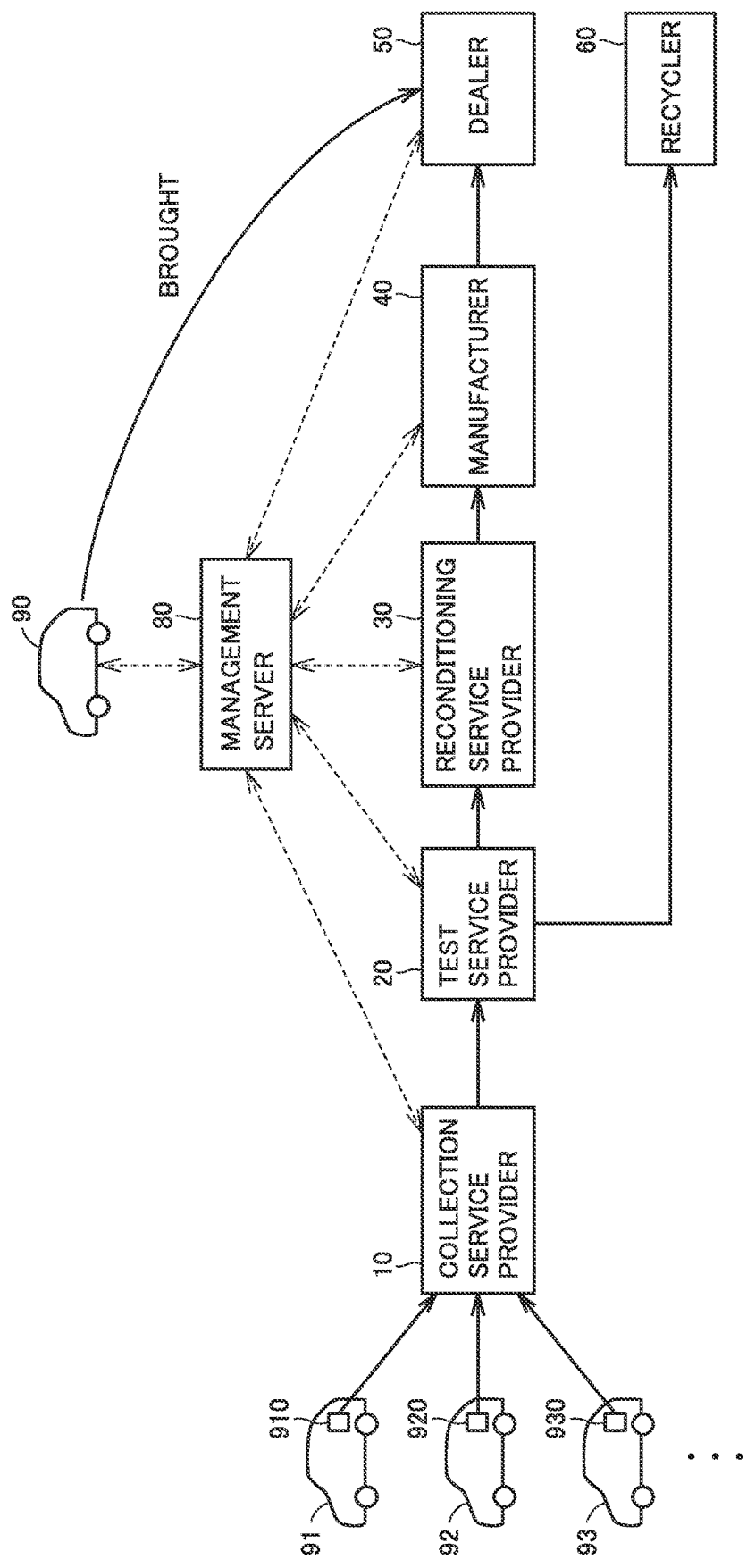
FIG. 1 is a diagram showing one manner of distribution from collection to manufacturing and sales of battery assemblies in the present embodiment.

An embodiment of the present disclosure will be described below in detail with reference to the drawings. The same or corresponding elements in the drawings have the same reference characters allotted and description thereof will not be repeated.

In the present disclosure, a battery assembly includes a plurality of battery modules (a battery module being abbreviated as a "module" below). The plurality of modules may be connected in series or in parallel. Each of the plurality of modules includes a plurality of secondary batteries (a secondary battery being denoted as a "cell" below) connected in series.

"Manufacturing" of a battery assembly in the present disclosure means manufacturing of a battery assembly by replacing at least one of a plurality of modules included in a battery assembly with other modules (replacement modules). Though the replacement module is basically a recyclable module taken out of a collected battery assembly, it may be a new module.

In general, "recycle" of a battery assembly is broadly categorized into reuse, rebuild, and resource recycle. In the case of reuse, collected battery assemblies are subjected to necessary shipment inspection and shipped as they are as reuse products. In the case of rebuild, collected battery assemblies are once disassembled to modules (which may be cells). Then, among the disassembled modules, modules which can be used after reconditioning (which may be modules which can be used as they are) are combined to manufacture a new battery assembly. Newly manufactured battery assemblies are subjected to shipment inspection and shipped as rebuilt products. In resource recycle, renewable materials are taken out of each module (each cell) and collected battery assemblies are not used as other battery assemblies.

In the embodiment described below, a battery assembly collected from a vehicle is once disassembled into modules and a performance test is conducted for each module. A battery assembly is manufactured from modules determined as being recyclable as a result of the performance test. Therefore, a recyclable module means a rebuildable module below. Depending on a configuration of a battery assembly, however, a battery assembly as it is can also be subjected to the performance test without being disassembled into modules. "Recycle" in such a case may encompass both of reuse and rebuild.

In the present embodiment, each cell is implemented by a nickel metal hydride battery. More specifically, a positive electrode is composed of nickel hydroxide (Ni(OH)$_2$) to which a cobalt oxide additive is added. A negative electrode is composed of a hydrogen storage alloy (based on MnNi5 which represents a nickel-based alloy). An electrolyte solution is composed of potassium hydroxide (KOH). These, however, are merely by way of example of a specific cell configuration, and a cell configuration to which the present disclosure is applicable is not limited thereto.

[Embodiment]

Figure 2:
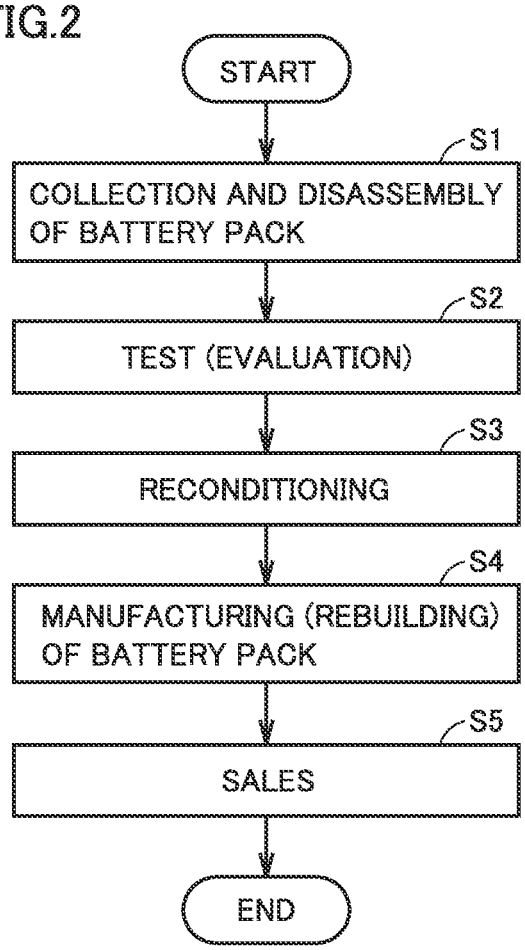
FIG. 2 is a flowchart showing a flow of processing in a battery distribution model shown in FIG. 1.

FIG. 1 is a diagram showing one manner of distribution from collection to manufacturing and sales of battery assemblies in the present embodiment. A manner of distribution shown in FIG. 1 is referred to as a "battery distribution model" below. FIG. 2 is a flowchart showing a flow of processing in the battery distribution model shown in FIG. 1.

Referring to FIGS. 1 and 2, in the battery distribution model, used battery assemblies are collected from a plurality of vehicles each incorporating battery assemblies, and battery assemblies are manufactured from recyclable modules included in the collected battery assemblies and then sold. A battery assembly mounted on a vehicle 90 of a certain user is replaced.

A collection service provider 10 collects used battery assemblies from vehicles 91 to 93. Battery assemblies 910 to 930 are mounted on vehicles 91 to 93, respectively. Though FIG. 1 shows only three vehicles due to space restriction, battery assemblies are actually collected from a larger number of vehicles. Collection service provider 10 disassembles the collected battery assemblies and takes out a plurality of modules from the battery assemblies (step S1, hereinafter the step being abbreviated as "S").

In this battery distribution model, identification information (ID) for identifying a module is provided for each module, and a management server 80 manages information on each module. Therefore, collection service provider 10 transmits an ID of each module taken out of a battery assembly to management server 80 through a terminal device 71 (see FIG. 3).

A test service provider 20 tests performance of each module collected by collection service provider 10 (S2). Specifically, test service provider 20 tests characteristics of the collected module. For example, test service provider 20 tests such electrical characteristics as a full charge capacity, a resistance value, an open circuit voltage (OCV), and a state of charge (SOC). Then, test service provider 20 classifies the modules into recyclable modules and non-recyclable modules based on results of the test, passes the recyclable modules to a reconditioning service provider 30 and the non-recyclable modules to a recycler 60. A test result of each module is transmitted to management server 80 through a terminal device 72 (see FIG. 3) of test service provider 20.

Reconditioning service provider 30 performs a process for reconditioning the module determined as recyclable by test service provider 20 (S3). By way of example, reconditioning service provider 30 restores a full charge capacity of the module by charging the module to an overcharged state. For a module determined as less in lowering in performance in the test by test service provider 20, the reconditioning process may be skipped. A result of reconditioning of each module is transmitted to management server 80 through a terminal device 73 (see FIG. 3) of reconditioning service provider 30.

A manufacturer 40 manufactures a battery assembly from modules reconditioned by reconditioning service provider 30 (S4). In the present embodiment, information (assembly information) for manufacturing a battery assembly is generated by management server 80 and transmitted to a terminal device 74 (see FIG. 3) of manufacturer 40. Manufacturer 40 manufactures (rebuilds) a battery assembly of vehicle 90 by replacing a module included in the battery assembly of vehicle 90 in accordance with the assembly information.

A dealer 50 sells the battery assembly manufactured by manufacturer 40 for vehicle use or for stationary use in a house or the like (S5). In the present embodiment, vehicle 90 is brought to dealer 50 and dealer 50 replaces the battery assembly of vehicle 90 with a reuse product or a rebuilt product manufactured by manufacturer 40.

Recycler 60 disassembles modules determined as being non-recyclable by test service provider 20 for reclamation for use as new cells or as source materials for other products.

Though collection service provider 10, test service provider 20, reconditioning service provider 30, manufacturer 40, and dealer 50 are service providers different from one another in FIG. 1, classification of the service providers is not limited as such. For example, a single service provider may serve as test service provider 20 and reconditioning service provider 30. Alternatively, collection service provider 10 may be divided into a service provider which collects battery assemblies and a service provider which disassembles collected battery assemblies. Locations of each service provider and each dealer are not particularly limited. Locations of each service provider and each dealer may be different or a plurality of service providers or dealers may be located at the same place.

Figure 3:
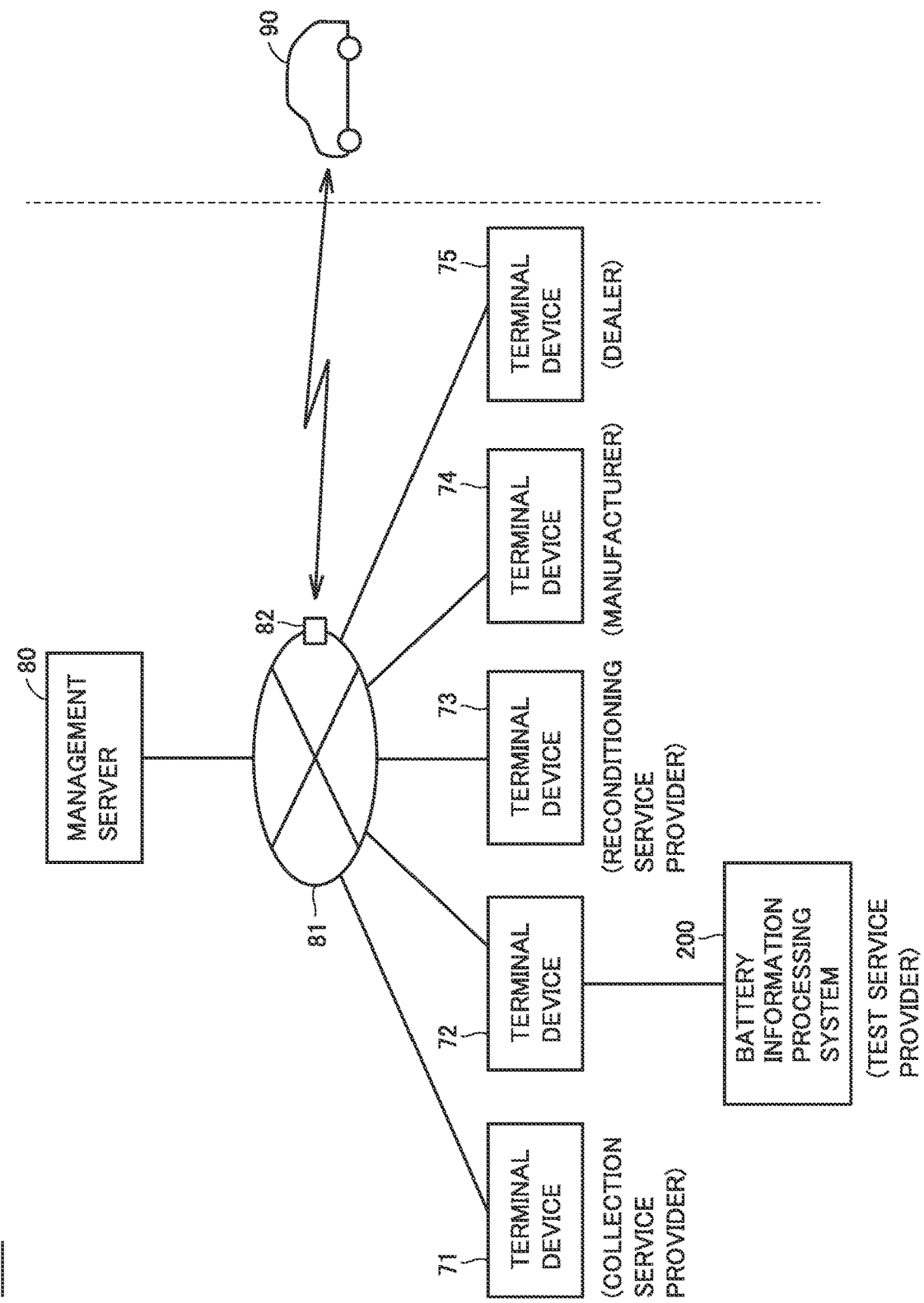
FIG. 3 is a diagram showing an exemplary configuration of a battery management system applied to the battery distribution model shown in FIG. 1.

FIG. 3 is a diagram showing an exemplary configuration of a battery management system applied to the battery distribution model shown in FIG. 1. Referring to FIG. 3, a battery management system 100 includes terminal devices 71 to 75, a management server 80, a communication network 81, and a base station 82.

Terminal device 71 is a terminal device of collection service provider 10. Terminal device 72 is a terminal device of test service provider 20. Terminal device 73 is a terminal device of reconditioning service provider 30. Terminal device 74 is a terminal device of manufacturer 40. Terminal device 75 is a terminal device of dealer 50.

Management server 80 and terminal devices 71 to 75 are configured to communicate with one another through communication network 81 such as the Internet or telephone lines. Base station 82 on communication network 81 is configured to be able to transmit and receive information to and from vehicle 90 through wireless communication.

In test service provider 20, a battery information processing system 200 for measuring an AC impedance of each module and determining a manner of recycle (rebuild and resource recycle) of the module based on a result of measurement is provided. The manner of recycle of the module determined by battery information processing system 200 is transmitted to management server 80, for example, through terminal device 72.

A situation in which a manner of recycle of a certain module (which is denoted as a "module M" below) among a plurality of modules included in battery assembly 910 taken out of vehicle 91 is determined by battery information processing system 200 will be described below. Though an example in which a full charge capacity of module M is evaluated as a representative characteristic of module M is described, a characteristic of the module other than the full charge capacity (for example, an internal resistance) may be evaluated. Alternatively, both of a full charge capacity and an internal resistance of a module may be evaluated.

<Configuration of Battery Information Processing System>

Figure 4:
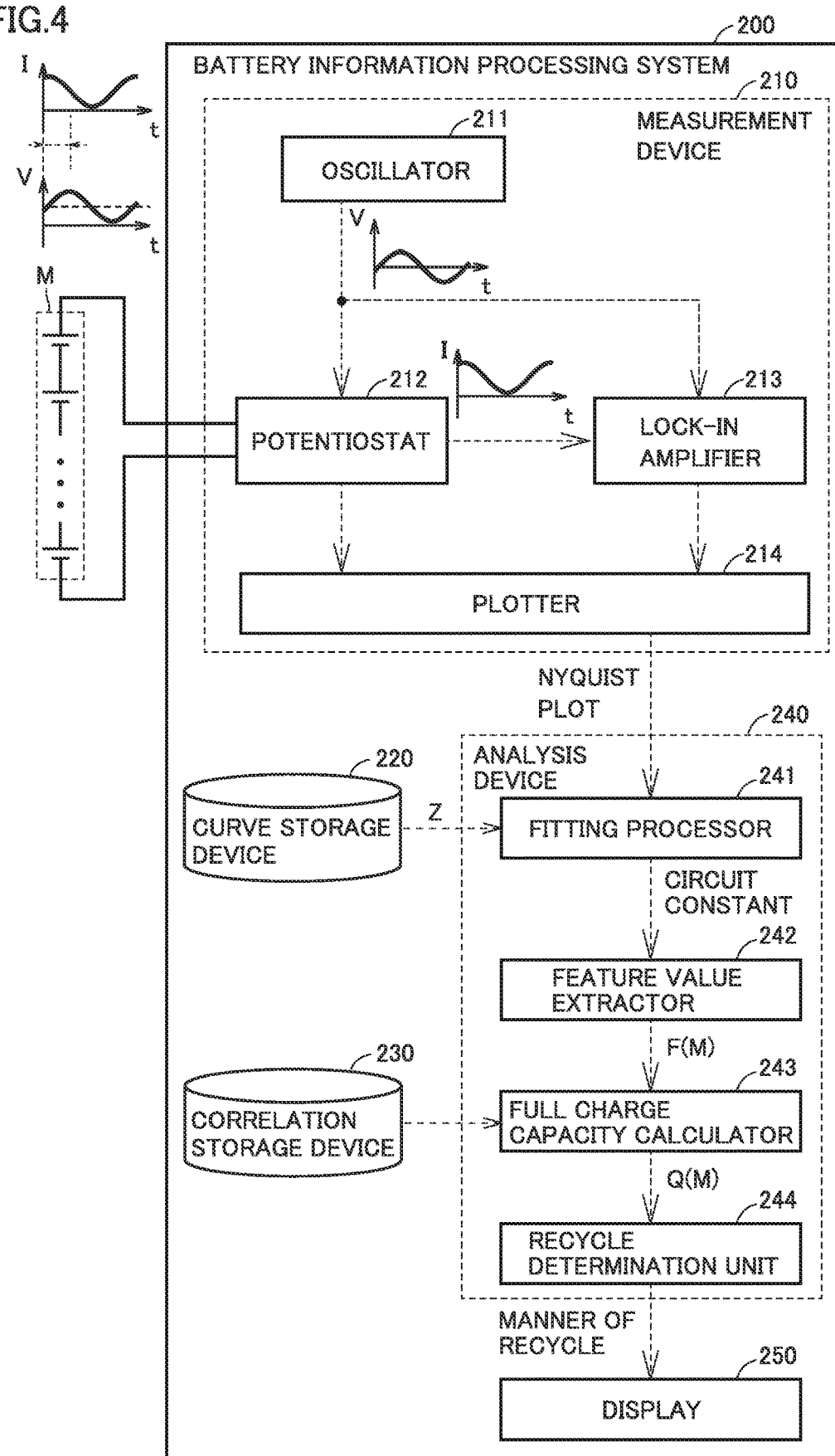
FIG. 4 is a diagram showing a configuration of a battery information processing system.

FIG. 4 is a diagram showing a configuration of battery information processing system 200. Battery information processing system 200 includes a measurement device 210, a curve storage device 220, a correlation storage device 230, an analysis device 240, and a display 250. These devices may be configured as devices independent of one another or as a single device.

Measurement device 210 measures an AC impedance of module M and outputs a Nyquist plot representing a result of measurement to analysis device 240. More specifically, measurement device 210 includes an oscillator 211, a potentiostat 212, a lock-in amplifier 213, and a plotter 214.

Oscillator 211 outputs sinusoidal waves identical in phase to potentiostat 212 and lock-in amplifier 213.

Potentiostat 212 generates an application signal by superimposing a prescribed direct-current (DC) voltage on an AC voltage (for example, a voltage at an amplitude around 10 mV) identical in phase to sinusoidal waves from oscillator 211 and applies the generated application signal to module M. Then, potentiostat 212 detects a current which flows through module M and outputs a result of detection to lock-in amplifier 213 as a response signal from module M. Potentiostat 212 outputs the application signal and the response signal to plotter 214.

Lock-in amplifier 213 compares a phase of the sinusoidal waves received from oscillator 211 with a phase of the response signal detected by potentiostat 212 and outputs a result of comparison (a phase difference between the sinusoidal waves and the response signal) to plotter 214.

Plotter 214 plots a result of measurement of an AC impedance of module M on a complex plane based on a signal from potentiostat 212 (a signal indicating an amplitude ratio between the application signal and the response signal) and a signal from lock-in amplifier 213 (a signal indicating a phase difference between the application signal and the response signal). More specifically, a frequency of sinusoidal waves output from oscillator 211 is swept in a prescribed frequency range and processing described previously is repeatedly performed by potentiostat 212 and lock-in amplifier 213. Thus, results of measurement of an AC impedance of module M for each frequency of sinusoidal waves are plotted on the complex plane. This plot is called a "Nyquist plot" (which may also be called a Cole-Cole plot). The Nyquist plot of module M is output to analysis device 240.

The configuration of measurement device 210 is not limited to the configuration shown in FIG. 4. For example, though description that an AC voltage is applied to module M and a current which flows through module M at that time is detected has been given, potentiostat 212 may detect a voltage response at the time of application of an AC current to module M. Measurement device 210 may include a frequency response analyzer (not shown) instead of lock-in amplifier 213.

An approach below can also be adopted as an approach to measurement of an AC impedance. Specifically, an application signal (one of a voltage signal and a current signal) including various frequency components within a prescribed frequency range is generated, and a response signal (the other of the voltage signal and the current signal) at the time of application of the application signal is detected. Each of the application signal and the response signal is subjected to fast Fourier transform (FFT) for frequency decomposition, to thereby calculate an AC impedance for each frequency. A Nyquist plot can be created also by such an approach.

Though details will be described below with reference to FIGS. 5 to 11, in the present embodiment, a full charge capacity Q(M) of module M is calculated by constructing an equivalent circuit model representing frequency characteristics of an AC impedance of module M. More specifically, initially, a combined impedance of module M is expressed by a prescribed expression (an impedance curve Z(M) described below) including a plurality of circuit constants (model parameters) included in the equivalent circuit model. Then, impedance curve Z(M) is subjected to fitting processing such that an error from discrete actual measurement data shown on the Nyquist plot is sufficiently small. A value of each circuit constant which determines a combined impedance of module M is thus calculated.

Furthermore, a feature value F(M) is extracted from a plurality of circuit constants (which will be described later) for expressing a combined impedance of module M, in accordance with a predetermined arithmetic equation. Correlation between a feature value F and a characteristic of a module (a full charge capacity Q in this example) has been found in preliminary experiments conducted by the present inventors. Therefore, full charge capacity Q(M) of module M can be calculated from feature value F(M) of module M by extracting feature value F(M) from the plurality of circuit constants corresponding to module M and referring to correlation between feature value F and full charge capacity Q.

Curve storage device 220 stores an impedance curve Z. A predetermined initial value is set as a value of each circuit constant (see FIG. 9) included in impedance curve Z. Curve storage device 220 outputs impedance curve Z in which the initial value is set as the circuit constant to analysis device 240 in response to a request from analysis device 240.

Figure 11:
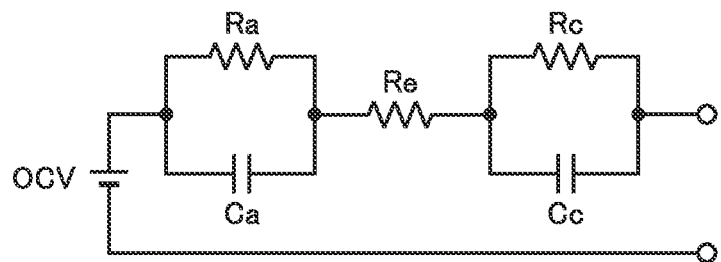
FIG. 11 is a diagram for illustrating an equivalent circuit model of a module for calculating a positive electrode time constant and a negative electrode time constant.

Correlation storage device 230 stores correlation between feature value F and full charge capacity Q of a module (see FIG. 11). Correlation storage device 230 is referred to by analysis device 240.

Though not shown, analysis device 240 is implemented, for example, by a microcomputer including a central processing unit (CPU), a memory, and an input/output port, and analyzes a Nyquist plot of module M obtained by measurement device 210. More specifically, analysis device 240 includes a fitting processor 241, a feature value extractor 242, a full charge capacity calculator 243, and a recycle determination unit 244.

Curve storage device 220 corresponds to the "storage device" according to the present disclosure. Analysis device 240 corresponds to the "evaluation device" according to the present disclosure. Therefore, curve storage device 220 and analysis device 240 correspond to the "battery information processing system" according to the present disclosure.

Fitting processor 241 reads impedance curve Z stored in curve storage device 220 and performs fitting processing (curve regression) of impedance curve Z so as to be best applied to the Nyquist plot created by plotter 214. Values of the plurality of circuit constants included in impedance curve Z are thus calculated and impedance curve Z(M) of module M is specified. The plurality of calculated circuit constants are output to feature value extractor 242.

Feature value extractor 242 extracts feature value F(M) from the plurality of circuit constants by performing a prescribed operation on the plurality of circuit constants. Extracted feature value F(M) is output to full charge capacity calculator 243.

Full charge capacity calculator 243 calculates a full charge capacity corresponding to feature value F(M) of module M by referring to correlation between feature value F and the full charge capacity stored in correlation storage device 230. Calculated full charge capacity Q(M) is output to recycle determination unit 244.

Recycle determination unit 244 determines a manner of recycle (rebuild or resource recycle) of module M in accordance with full charge capacity Q(M) of module M. Recycle determination unit 244 may determine whether or not module M is recyclable. A result of determination by recycle determination unit 244 is output to display 250.

Display 250 is implemented, for example, by a liquid crystal display and shows a result of determination by recycle determination unit 244. Test service provider 20 can thus know how module M should be processed.

<Flow of Determination of Manner of Recycle>

In succession, a process flow for determining a manner of recycle of module M will be described in detail.

Figure 5:
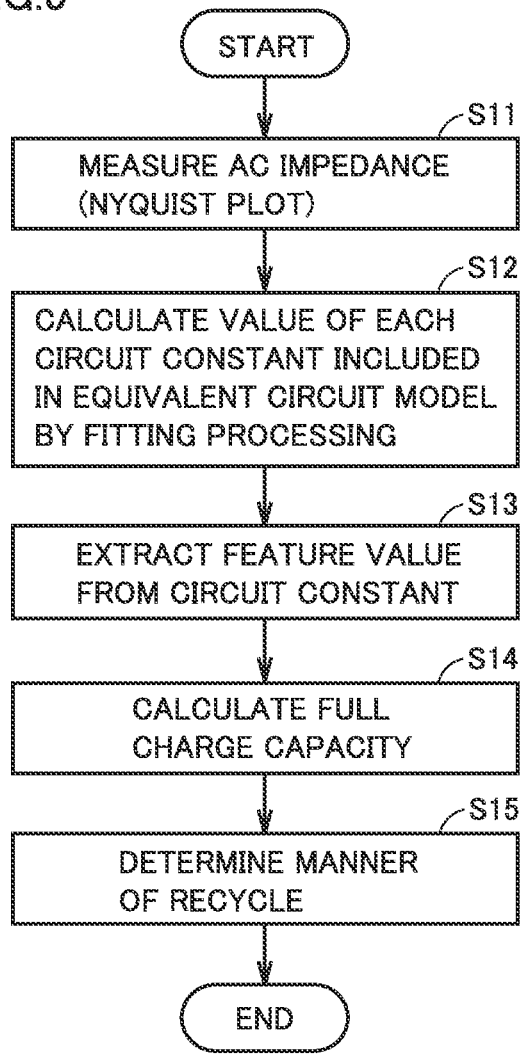
FIG. 5 is a flowchart showing processing for determining a manner of recycle of a module in the present embodiment.

FIG. 5 is a flowchart showing processing for determining a manner of recycle of module M in the present embodiment. This flowchart is executed by battery information processing system 200, for example, when test service provider 20 sets module M in battery information processing system 200 and operates a not-shown operation portion (such as a start button).

For the sake of brevity of description, components (such as plotter 214 of measurement device 210 or fitting processor 241 of analysis device 240) of battery information processing system 200 as an entity to perform each type of processing are not particularly distinguished below and they are comprehensively denoted as a "processing device 200." Though each step is basically performed by software processing by processing device 200, it may partly or entirely be performed by hardware (an electric circuit) provided in processing device 200.

In step S11, processing device 200 measures an AC impedance of module M and obtains a Nyquist plot from a result of measurement. Since the approach to measurement of an AC impedance has been described in detail in description of the configuration of measurement device 210 with reference to FIG. 4, description will not be repeated.

Figure 6:
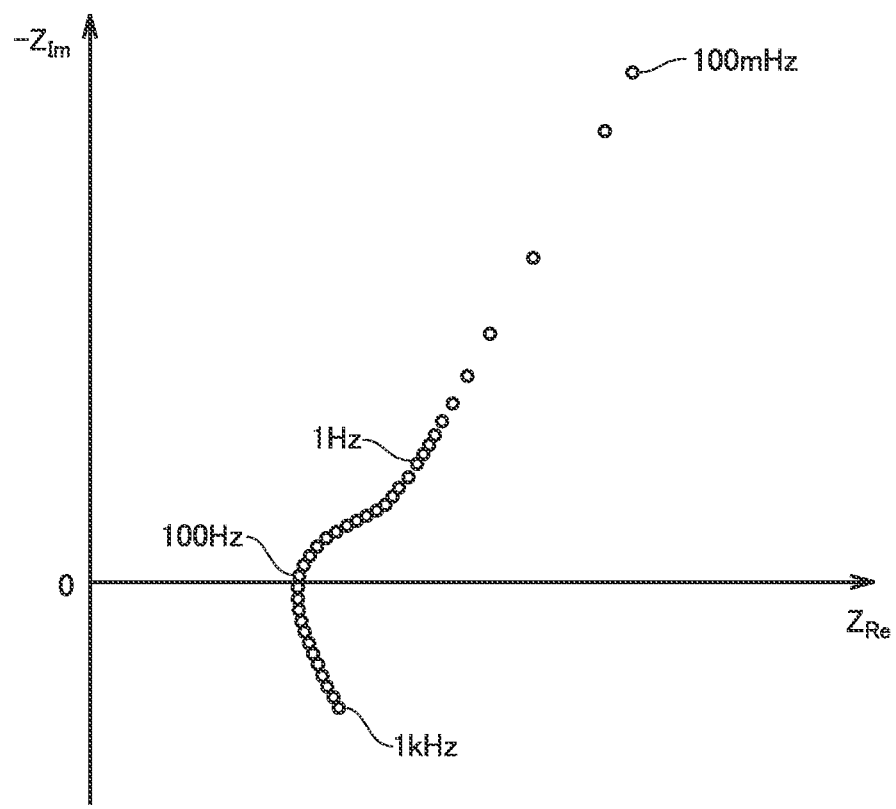
FIG. 6 is a diagram showing one example of a Nyquist plot of a result of measurement of an AC impedance of a module.
Figure 10:
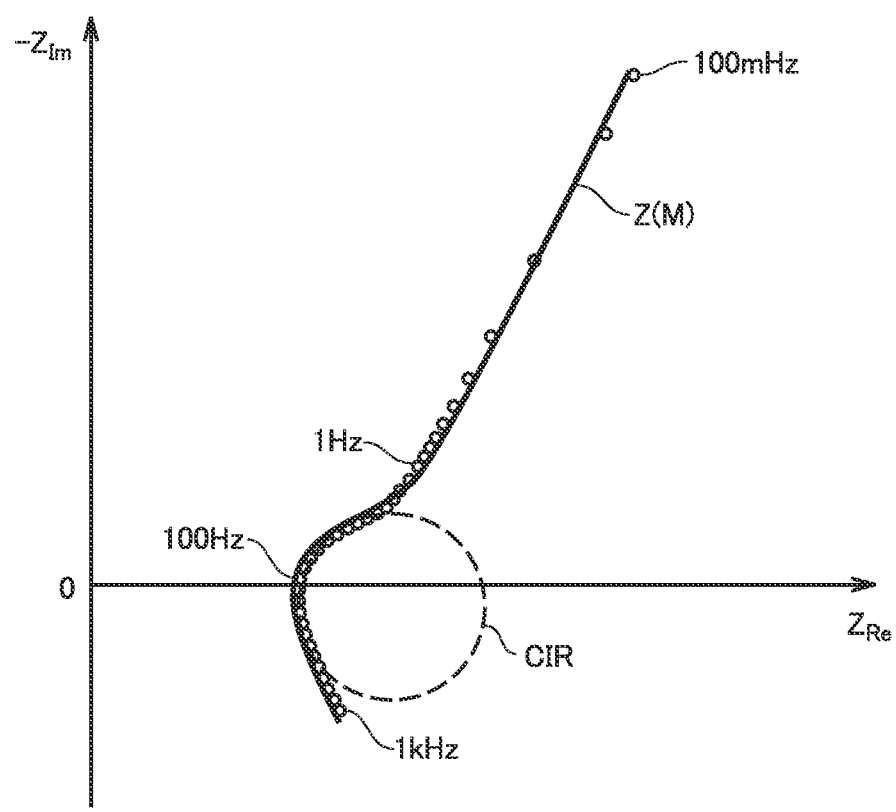
FIG. 10 is a diagram for illustrating an impedance curve obtained by fitting processing of the result of measurement of the AC impedance of the module shown in FIG. 6.

FIG. 6 is a diagram showing one example of a Nyquist plot of a result of measurement of an AC impedance of module M. In FIG. 6 and FIGS. 10 and 11 which will be described later, the abscissa represents a real number component $Z_{Re}$ of a complex impedance of module M and the ordinate represents an imaginary number component $-Z_{Im}$ of the complex impedance of module M.

FIG. 6 shows one example of a result of measurement of an AC impedance when a frequency of an application signal is swept within a range from 100 mHz to 1 kHz. As shown in FIG. 6, in the Nyquist plot, a result of measurement of an AC impedance of module M in accordance with a frequency of the application signal is plotted on the complex plane as a discrete value.

Referring again to FIG. 5, in S12, processing device 200 performs fitting processing of impedance curve Z(M) of module M such that an error from the AC impedance of module M (a value measured in S11) is minimized, for example, by the non-linear least square method. Specifically, processing device 200 calculates, for each frequency of the application signal, a coordinate plotted (measured) at that frequency and a coordinate on impedance curve Z(M) corresponding to the frequency. Processing device 200 calculates a square of a distance (an error) between these coordinates for all frequencies of the application signal and totals the calculated values. Processing device 200 calculates a square sum of errors and adjusts values of a plurality of circuit constants included in the equivalent circuit model so as to minimize the square sum of the errors. As a result of adjustment of such circuit constants, the plurality of circuit constants are converged to satisfy a prescribed condition, so that impedance curve Z(M) is specified.

When an excessively simplified equivalent circuit model is adopted in this analysis process, a fitting error of impedance curve Z(M) is greater and accurate impedance curve Z(M) cannot be derived. Then, a characteristic (in this example, a full charge capacity) of module M cannot highly accurately be evaluated either. On the other hand, it is not realistic either to adopt a precise equivalent circuit model as shown in a comparative example below.

Figure 7:
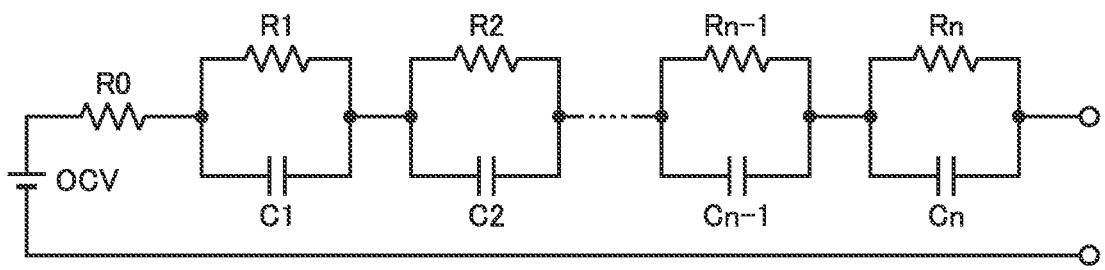
FIG. 7 is a diagram showing an equivalent circuit model of a module in a comparative example.

FIG. 7 is a diagram showing an equivalent circuit model of module M in a comparative example. As shown in the comparative example, with importance being placed on preciseness of the equivalent circuit model, an equivalent circuit model in which n (typically, cell number n=several to several ten) RC parallel circuits included in module M are connected in series is adopted. A fitting error in fitting processing of impedance curve Z is thus lessened and accuracy in fitting can be improved.

When such an equivalent circuit model is adopted, however, as the number of cells n increases, the number of circuit constants also increases. Therefore, when the number of cells n is set to 6 by way of example, thirteen circuit constants (seven resistance components R0 to R6 and six capacitance components C1 to C6) are present and it may take a long time to perform fitting processing.

In the battery distribution model described with reference to FIGS. 1 and 2, battery assemblies are collected from a large number of vehicles and hence a characteristic (a degree of progress of deterioration) of a large number of modules is required to highly efficiently be evaluated in a period as short as possible. Therefore, it is realistically difficult to adopt an academically precise equivalent circuit model.

The present inventors have found that finally calculated full charge capacity Q well matches with an actual full charge capacity (a full charge capacity that is highly accurately measured separately) by adopting an equivalent circuit model including an appropriate circuit constant. Since this equivalent circuit model is relatively simplified in configuration, time required for fitting processing is also relatively short. Therefore, it is suitable also for evaluation of a large number of battery assemblies. The equivalent circuit model adopted in the present embodiment will be described below in detail.

Figure 8:
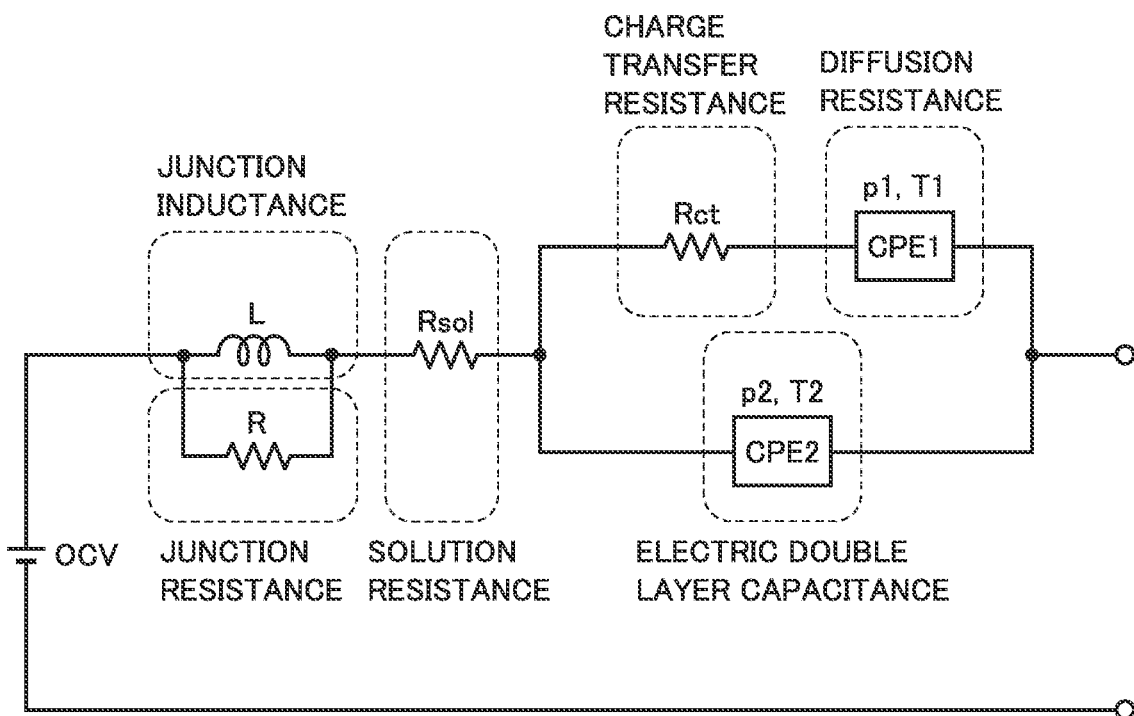
FIG. 8 is a diagram showing an equivalent circuit model of a module in the present embodiment.

FIG. 8 is a diagram showing an equivalent circuit model of a module in the present embodiment. FIG. 9 is a diagram for illustrating a circuit constant included in the equivalent circuit model shown in FIG. 8. Referring to FIGS. 8 and 9, in the present embodiment, an equivalent circuit model representing a frequency characteristic of an AC impedance of a module includes as circuit constants, a junction inductance L, a junction resistance R, a solution resistance Rsol, a charge transfer resistance Rct, a diffusion resistance (denoted as CPE1), and an electric double layer capacitance (denoted as CPE2).

Junction inductance L refers to an inductance component in a portion of junction between cells included in a module (a portion of junction between the positive electrode and the negative electrode). Junction resistance R refers to a resistance component in the junction portion. Solution resistance Rsol refers to a resistance component of an electrolyte solution present between the positive electrode and the negative electrode. Charge transfer resistance Rct refers to a resistance component relating to transfer of charges (supply and reception of charges) at an electrode/electrolyte interface (surfaces of a positive electrode active material and a negative electrode active material). The diffusion resistance refers to a resistance component relating to diffusion of a charge transfer material in salt or an active material in the electrolyte solution. The electric double layer capacitance refers to a capacitance component of an electric double layer formed at an electrode/electrolyte solution interface. Each of these circuit constants results from combination of corresponding components in all cells in the module.

Junction inductance L and junction resistance R are connected in parallel to each other. Solution resistance Rsol is connected in series to a parallel circuit of junction inductance L and junction resistance R. Charge transfer resistance Rct and the diffusion resistance are connected in series to each other. A series circuit of charge transfer resistance Rct and the diffusion resistance and the electric double layer capacitance are connected in parallel to each other. A combined circuit including junction inductance L, junction resistance R, and solution resistance Rsol and a combined circuit including charge transfer resistance Rct, the diffusion resistance, and the electric double layer capacitance are connected in series to each other.

In the present embodiment, in order to appropriately express a capacitive behavior of module M which is shown later in FIG. 10, each of the diffusion resistance and the electric double layer capacitance of the module is expressed by a non-linear element called a constant phase element (CPE). More specifically, an impedance $Z_{CPE1}$ corresponding to the diffusion resistance is expressed as shown in an expression (1) below with a CPE index p1 and a CPE constant T1. In the expression (1), an angular frequency of an AC signal applied to the module (application signal) is denoted as ω ($\omega = 2\pi f$).

$$Z_{CPE1}=1/\{(j\omega)^{p1} \times T1\} \quad (1)$$

Similarly, an impedance $Z_{CPE2}$ corresponding to the electric double layer capacitance can also be expressed as shown in an expression (2) below with a CPE index p2 and a CPE constant T2.

$$Z_{CPE2}=1/\{(j\omega)^{p2} \times T2\} \quad (2)$$

In the present embodiment, the equivalent circuit model including eight circuit constants shown in FIGS. 8 and 9 is adopted. Values of eight circuit constants are calculated by fitting processing with the eight circuit constants being adopted as fitting parameters, so that impedance curve Z(M) corresponding to module M is specified (see S12 in FIG. 5).

FIG. 10 is a diagram showing impedance curve Z(M) obtained by fitting processing of the result of measurement of the AC impedance of module M shown in FIG. 6. FIG. 10 shows with a bold line, a curve representing impedance curve Z(M) specified by fitting processing.

Processing device 200 substitutes an initial value (a predetermined value) of each of the eight circuit constants shown in FIG. 9 into impedance curve Z and repeats fitting processing, for example, by the non-linear least square method until a prescribed convergence condition is satisfied (for example, a value representing a degree of fitting in fitting processing such as a chi-square value becomes lower than a criterion value). When the convergence condition in fitting processing is satisfied, impedance curve Z(M) of module M is specified by the eight converged circuit constants. A fitting algorithm is not limited to the least square method, and another algorithm (for example, maximum likelihood estimation) can also be adopted.

In succession, processing device 200 allows the process to proceed to S13 shown in FIG. 5 and extracts feature value F(M) from the eight circuit constants at the time when the convergence condition is satisfied.

Which feature value should be extracted to establish correlation between the feature value and full charge capacity Q of the module is confirmed in advance in experiments. More specifically, relation between feature value F and full charge capacity Q (a full charge capacity measured by actual charging and discharging of the module) of a large number of (for example, several hundred to several thousand) modules is experimentally found. By way of example, correlation expressed by a linear function as in an expression (3) below is established between feature value F and full charge capacity Q (a being a number other than 0).

$$Q = a \times F + b \quad (3)$$

In S13, specific feature value F(M) of which correlation with full charge capacity Q(M) has been confirmed is extracted from impedance curve Z(M). Such feature value F(M) can be extracted from the eight circuit constants, for example, by a statistic approach such as multiple regression analysis. In this multiple regression analysis, for example, in consideration of a real number value and an imaginary number value on impedance curve Z(M) as well as kurtosis, skewness, and multicolinearity of each component such as an inclination of a tangential line at each frequency, for some of the eight circuit constants, a feature value can be extracted by multiplying each circuit constant by a weight coefficient greater than that for remaining circuit constants.

When feature value F(M) is extracted from the eight circuit constants, processing device 200 calculates full charge capacity Q(M) of module M based on extracted feature value F(M) (S14).

Thereafter, processing device 200 determines a manner of recycle of module M in accordance with full charge capacity Q(M) of module M. For example, processing device 200 calculates a capacity retention which represents a ratio ($=Q(M)/Q_0$) between current full charge capacity Q(M) of module M and an initial full charge capacity $Q_0$ (a value already known from specifications of module M) and compares the capacity retention with a prescribed reference value. When the capacity retention of module M is not lower than the reference value, processing device 200 determines that module M can be used for rebuild of a battery assembly, and when the capacity retention of module M is lower than the reference value, it determines that module M cannot be used for rebuild (resources should be recycled).

<Application Condition>

In succession, a condition under which the method of evaluating a characteristic of a battery module shown in FIGS. 4 to 10 (the method of analyzing a result of measurement of an AC impedance) is preferably applied will be described.

In the example shown in FIG. 10, in a frequency range from 1 Hz to 1 kHz where a frequency f is relatively high, impedance curve Z(M) is in an arc shape. A vector locus in this arc shape is also called a "capacitive loop." In general, the capacitive loop is in such a shape that an oval shape derived from the negative electrode of the secondary battery and an oval shape derived from the positive electrode thereof are combined.

The example in FIG. 10 shows only a capacitive loop with only a single oval. The capacitive loop, however, may be separated into two parts depending on progress of deterioration of the positive electrode and the negative electrode. The present inventors have found that the method of evaluating a characteristic described with reference to FIGS. 4 to 10 is applicable when the oval shape derived from the negative electrode and the oval shape derived from the positive electrode are superimposed on each other and the capacitive loop can be approximated to a single oval. Whether the capacitive loop is represented as a single oval resulting from superimposition of two ovals or as two separate ovals can be determined based on a positive electrode time constant τc (a parameter representing an oval-shape characteristic derived from the positive electrode) and a negative electrode time constant τa (a parameter representing an oval-shape characteristic derived from the negative electrode) as shown below.

FIG. 11 is a diagram for illustrating an equivalent circuit model of a module for calculating positive electrode time constant τc and negative electrode time constant τa. FIGS. 12A to 12D are diagrams showing examples of a result of simulation for illustrating influence on a capacitive loop by positive electrode time constant τc and negative electrode time constant τa.

In the equivalent circuit model shown by way of example in FIG. 11, Rc represents a charge transfer resistance of the positive electrode, Cc represents an electric double layer capacitance of the positive electrode, Ra represents a charge transfer resistance of the negative electrode, and Ca represents an electric double layer capacitance of the negative electrode.

Charge transfer resistance Rc represents a combined resistance of charge transfer resistances of the positive electrodes in all cells in a module. This is also applicable to charge transfer resistance Ra of the negative electrode. Electric double layer capacitance Cc of the positive electrode represents a combined electric double layer capacitance of the positive electrodes in all cells in a module. This is also applicable to electric double layer capacitance Ca of the negative electrode.

Charge transfer resistance Rc and electric double layer capacitance Cc of the positive electrode implement an RC parallel circuit. With a time constant of the RC parallel circuit being denoted as "positive electrode time constant $\tau c$," relation of $\tau c = Rc \times Cc$ is satisfied. Positive electrode time constant $\tau c$ reflects a degree of deterioration of the positive electrode in each cell in the module. Similarly, charge transfer resistance Ra and electric double layer capacitance Ca of the negative electrode implement an RC parallel circuit. With a time constant of the RC parallel circuit being denoted as "negative electrode time constant $\tau a$," relation of $\tau a = Ra \times Ca$ is satisfied. Negative electrode time constant $\tau a$ reflects a degree of deterioration of the negative electrode in each cell in the module.

FIG. 11 shows an electrolyte solution resistance with Re. Electrolyte solution resistance Re may also include a contact resistance or an interconnection resistance of the positive electrode and the negative electrode in addition to a resistance component of an electrolyte solution between the positive electrode and the negative electrode. A parallel circuit of charge transfer resistance Rc and electric double layer capacitance Cc of the positive electrode, a parallel circuit of charge transfer resistance Ra and electric double layer capacitance Ca of the negative electrode, and electrolyte solution resistance Re are connected in series.

In the present embodiment, five circuit constants included in the equivalent circuit model shown in FIG. 11 are calculated. Specifically, fitting processing of a function (a function different from impedance curve Z shown in FIG. 10) corresponding to the equivalent circuit model shown in FIG. 11 is performed on the result of measurement of an AC impedance as shown in FIG. 6. Since a value of each circuit constant shown in FIG. 11 is thus calculated, positive electrode time constant $\tau c$ and negative electrode time constant $\tau a$ can be calculated.

A ratio between positive electrode time constant $\tau c$ and negative electrode time constant $\tau a$ is referred to below as a "time constant ratio" R. When relation of $\tau c \geq \tau a$ is satisfied between positive electrode time constant $\tau c$ and negative electrode time constant $\tau a$, setting of $R = \tau c / \tau a$ is made, and when relation of $\tau c < \tau a$ is satisfied, setting of $R = \tau a / \tau c$ is made. Therefore, time constant ratio R is not smaller than 1 ($R \geq 1$).

Figure 12A:
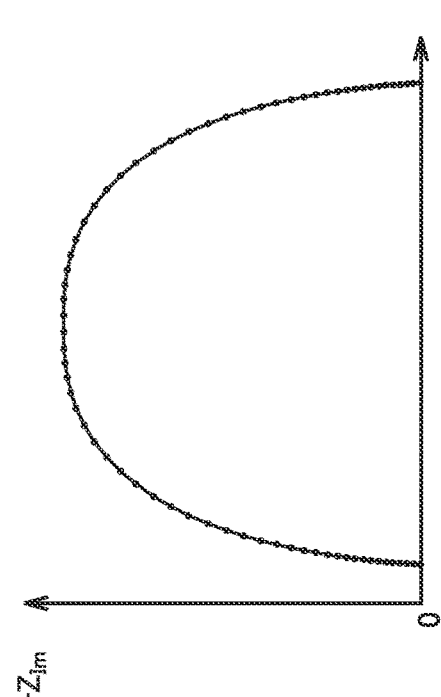
FIGS. 12A to 12D are diagrams showing examples of a result of simulation for illustrating influence on a capacitive loop by a positive electrode time constant and a negative electrode time constant.
Figure 12B:
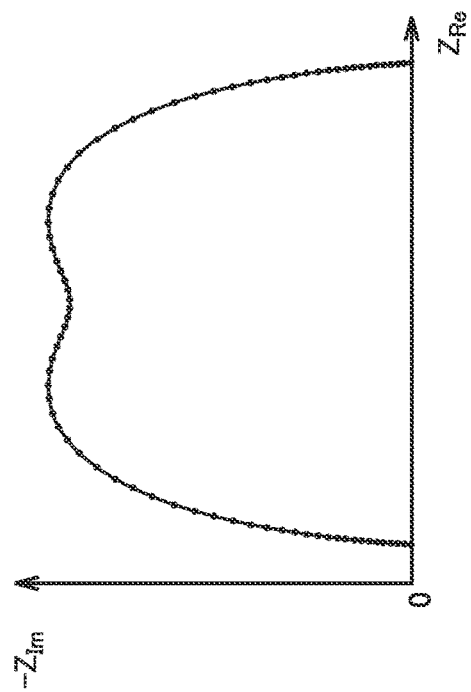
Figure 12C:
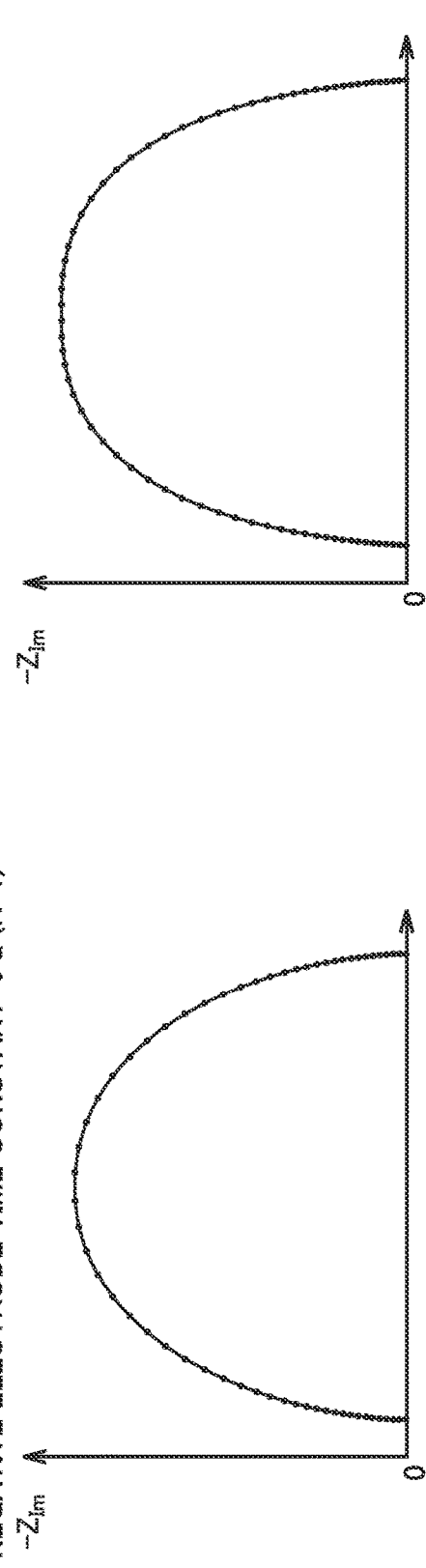
Figure 12D:
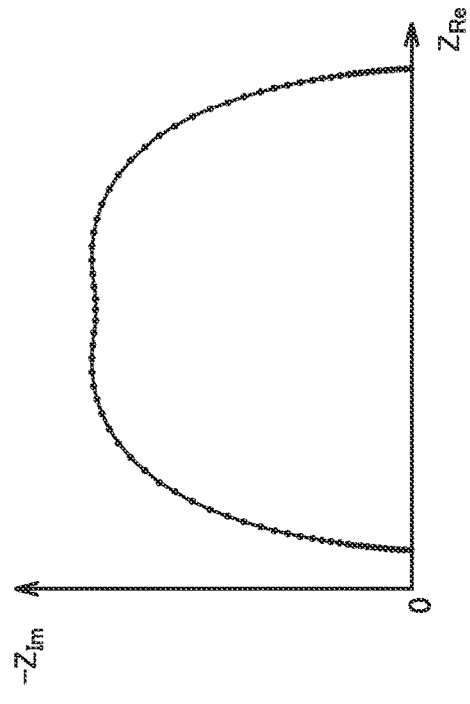

FIG. 12A shows a capacitive loop when positive electrode time constant $\tau c$ and negative electrode time constant $\tau a$ are equal to each other (that is, time constant ratio R=1). FIG. 12B shows a capacitive loop when a condition of time constant ratio R=5 is satisfied. FIG. 12C shows a capacitive loop when a condition of time constant ratio R=7 is satisfied. FIG. 12D shows a capacitive loop when a condition of time constant ratio R=10 is satisfied.

It can be seen in the examples shown in FIGS. 12A and 12B that, when time constant ratio R is not greater than 5, a semicircle derived from the positive electrode and a semicircle derived from the negative electrode are superimposed on each other and a single capacitive loop is exhibited. It can be seen in the examples shown in FIGS. 12C and 12D that, when time constant ratio R is not smaller than 7, the capacitive loop is divided into two parts. A boundary value (which corresponds to a "prescribed value" according to the present disclosure) is present in a range where time constant ratio R is not smaller than 5 and not greater than 7, a single capacitive loop is exhibited when time constant ratio R is smaller than the boundary value, and the capacitive loop is separated into two parts when time constant ratio R is not smaller than the boundary value.

More specifically, an inclination of a tangential line at the time when the capacitive loop is differentiated is found. When time constant ratio R is smaller than the boundary value, the inclination of the tangential line monotonously decreases as expressed as positive-0-negative, with increase in real number component of an impedance. In other words, the capacitive loop can be approximated to a single oval. When time constant ratio R is not smaller than the boundary value, the inclination of the tangential line is varied as expressed as positive-0-negative-0-positive-0-negative, with increase in real number component of an impedance. In other words, the capacitive loop is separated into two ovals.

Based on this finding, in the present embodiment, it is considered that a single capacitive loop is exhibited when time constant ratio R is lower than the boundary value, and the method of evaluating a characteristic of a battery module shown in FIGS. 4 to 10 is applicable. The present inventors have collected a large number of battery assemblies from vehicles used under various conditions, calculated time constant ratios R of modules included in the collected battery assemblies, and found that time constant ratio R was at the boundary value in each module. Therefore, the method of evaluating a characteristic of a battery module in the present embodiment can be concluded as being applicable at least to a module taken out of a battery assembly mounted on a vehicle.

<Accuracy in Calculating Full Charge Capacity>

Accuracy in calculating a full charge capacity by a method of determining a manner of recycle of a module in the present embodiment will finally be described.

Figure 13A:
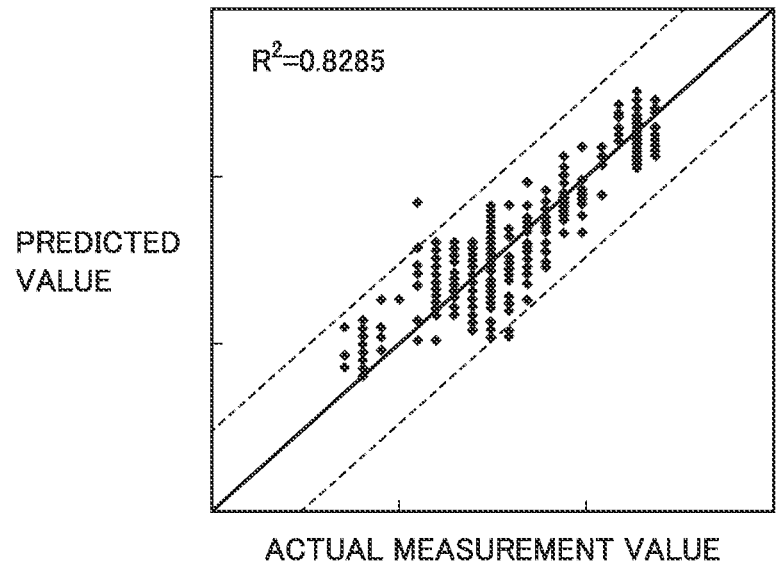
FIGS. 13A and 13B are diagrams for illustrating accuracy in calculating a full charge capacity of a module in the present embodiment.
Figure 13B:
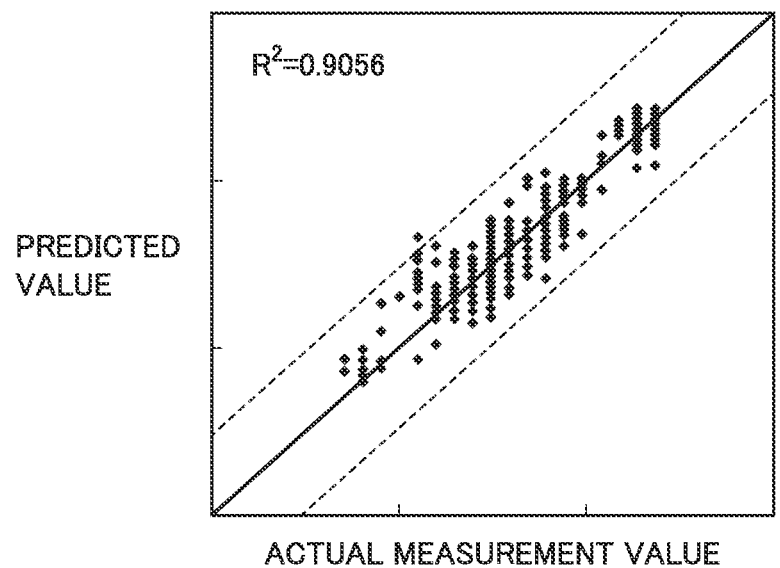

FIGS. 13A and 13B are diagrams for illustrating accuracy in calculating a full charge capacity of a module in the present embodiment. The abscissa in FIGS. 13A and 13B represents an actual full charge capacity of a module (which is a full charge capacity measured by actually charging and discharging a module and denoted as an "actual measurement value"). The ordinate in FIG. 13A represents a full charge capacity of a module calculated by using an equivalent circuit model different from that in the present embodiment (which is denoted as a "predicted value"). The ordinate in FIG. 13B represents a full charge capacity of a module calculated by using the equivalent circuit model (see FIG. 8) in the present embodiment (which is similarly denoted as a "predicted value").

When the equivalent circuit model different from that in the present embodiment is employed, a correlation coefficient $R^2$ between the actual measurement value and the predicted value of the full charge capacity is 0.8285 (see FIG. 13A). In contrast, with the equivalent circuit model in the present embodiment, correlation coefficient $R^2$ increases to 0.9056 as shown in FIG. 13B. Namely, correlation between the actual measurement value and the predicted value of the full charge capacity becomes higher. Thus, according to the present embodiment, improvement in accuracy in calculating a full charge capacity of a module is confirmed.

As set forth above, in the present embodiment, an equivalent circuit model including the eight circuit constants shown in FIGS. 8 and 9 as fitting parameters is adopted. By adopting this equivalent circuit model, full charge capacity Q(M) of module M can highly accurately be calculated as demonstrated in FIGS. 13A and 13B. Fitting processing of the eight parameters requires more simplified operation than fitting processing of a larger number of parameters (for example, thirteen parameters in an example where the number of cells in the module is set to six in the equivalent circuit model in the comparative example shown in FIG. 7)

and hence it can achieve a shorter time period for analysis. Therefore, the equivalent circuit model can suitably be adopted also in a scenario where a large number of battery modules are to be evaluated as described with reference to FIGS. 1 and 2.

Though the embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A battery information processing system which processes information for evaluating a characteristic of a battery module including a plurality of secondary batteries, the battery information processing system comprising:
    a storage device configured to store an equivalent circuit model, the equivalent circuit model expressing an AC impedance of the battery module with first to eighth circuit constants; and
    an evaluation device configured to calculate the first to eighth circuit constants by fitting processing of a Nyquist plot in which a result of measurement of the AC impedance of the battery module is plotted and to evaluate a characteristic of the battery module based on the equivalent circuit model including the calculated first to eighth circuit constants,
    the first circuit constant being a junction inductance of the battery module,
    the second circuit constant being a junction resistance of the battery module,
    the third circuit constant being a solution resistance of the battery module,
    the fourth circuit constant being a charge transfer resistance of the battery module,
    the fifth circuit constant being a constant phase element (CPE) index of a diffusion resistance of the battery module,
    the sixth circuit constant being a CPE constant of the diffusion resistance of the battery module,
    the seventh circuit constant being a CPE index of an electric double layer capacitance of the battery module, and
    the eighth circuit constant being a CPE constant of the electric double layer capacitance of the battery module.

2. The battery information processing system according to claim 1, wherein in the equivalent circuit model,
    the junction inductance and the junction resistance are connected in parallel to each other, forming a parallel circuit,
    the solution resistance is connected in series to the parallel circuit of the junction inductance and the junction resistance,
    the charge transfer resistance and the diffusion resistance are connected in series to each other, forming a series circuit,
    the electric double layer capacitance is connected in parallel to the series circuit of the charge transfer resistance and the diffusion resistance, and
    a combined circuit including the junction inductance, the junction resistance, and the solution resistance and a combined circuit including the charge transfer resistance, the diffusion resistance, and the electric double layer capacitance are connected in series to each other.

3. The battery information processing system according to claim 1, wherein
    the evaluation device is configured to evaluate the characteristic of the battery module when a capacitive loop of the battery module shown on the Nyquist plot can be approximated to a single oval.

4. The battery information processing system according to claim 3, wherein
    the capacitive loop can be approximated to an oval when a ratio between a positive electrode time constant and a negative electrode time constant is lower than a prescribed value, the positive electrode time constant representing a degree of deterioration of a positive electrode of the battery module, the negative electrode time constant representing a degree of deterioration of a negative electrode of the battery module.

5. The battery information processing system according to claim 1, wherein
    each of the plurality of secondary batteries is a nickel metal hydride battery, and
    the characteristic of the battery module is at least one of a full charge capacity and an internal resistance of the battery module.

6. A battery assembly comprising:
    a plurality of the battery modules of which characteristic has been evaluated by the battery information processing system according to claim 1.

7. A method of evaluating a characteristic of a battery module including a plurality of secondary batteries, the method comprising:
    obtaining a Nyquist plot from a result of measurement of an AC impedance of the battery module;
    calculating first to eighth circuit constants included in an equivalent circuit model of the AC impedance of the battery module by fitting processing of the Nyquist plot; and
    evaluating a characteristic of the battery module based on the equivalent circuit model including the first to eighth circuit constants,
    the first circuit constant being a junction inductance of the battery module,
    the second circuit constant being a junction resistance of the battery module,
    the third circuit constant being a solution resistance of the battery module,
    the fourth circuit constant being a charge transfer resistance of the battery module,
    the fifth circuit constant being a CPE index of a diffusion resistance of the battery module,
    the sixth circuit constant being a CPE constant of the diffusion resistance of the battery module,
    the seventh circuit constant being a CPE index of an electric double layer capacitance of the battery module, and
    the eighth circuit constant being a CPE constant of the electric double layer capacitance of the battery module.

8. A method of manufacturing a battery assembly comprising:
    obtaining a Nyquist plot from a result of measurement of an AC impedance of a battery module including a plurality of secondary batteries;
    calculating first to eighth circuit constants included in an equivalent circuit model of the AC impedance of the battery module by fitting processing of the Nyquist plot;
    evaluating a characteristic of the battery module based on the equivalent circuit model including the first to eighth circuit constants; and manufacturing a battery assembly from a plurality of battery modules of which characteristic has been evaluated in the evaluating a characteristic, the first circuit constant being a junction inductance of the battery module, the second circuit constant being a junction resistance of the battery module, the third circuit constant being a solution resistance of the battery module, the fourth circuit constant being a charge transfer resistance of the battery module, the fifth circuit constant being a CPE index of a diffusion resistance of the battery module, the sixth circuit constant being a CPE constant of the diffusion resistance of the battery module, the seventh circuit constant being a CPE index of an electric double layer capacitance of the battery module, and the eighth circuit constant being a CPE constant of the electric double layer capacitance of the battery module.

* * * * *